United States Patent
Yu et al.

(10) Patent No.: US 7,952,086 B2
(45) Date of Patent: May 31, 2011

(54) PHASE-CHANGE NONVOLATILE MEMORY DEVICE USING SB-ZN ALLOY

(75) Inventors: Byoung Gon Yu, Daejeon (KR); Sung Min Yoon, Daejeon (KR); Se Young Choi, Gyeonggi-do (KR); Tae Jin Park, Gyeonggi-do (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 313 days.

(21) Appl. No.: 12/122,152

(22) Filed: May 16, 2008

(65) Prior Publication Data

US 2008/0283817 A1 Nov. 20, 2008

(30) Foreign Application Priority Data

May 16, 2007 (KR) .................. 10-2007-0047526

(51) Int. Cl.
*H01L 45/00* (2006.01)
(52) U.S. Cl. .............. 257/3; 257/4; 257/E45.002
(58) Field of Classification Search ....... 257/3, E45.002, 257/4
See application file for complete search history.

(56) References Cited

U.S. PATENT DOCUMENTS

| | | | |
|---|---|---|---|
| 5,534,712 | A | 7/1996 | Ovshinsky et al. |
| RE37,259 | E | 7/2001 | Ovshinsky |
| 6,740,921 | B2 | 5/2004 | Matsuoka et al. |
| 6,841,793 | B2 * | 1/2005 | Lee .................... 257/3 |
| 6,942,728 | B2 | 9/2005 | Caillat et al. |
| 2006/0049389 | A1 * | 3/2006 | Lankhorst et al. ........... 257/2 |

FOREIGN PATENT DOCUMENTS

| | | |
|---|---|---|
| JP | 2000185466 | 7/2000 |
| JP | 2000185467 | 7/2000 |
| JP | 2000190634 | 7/2000 |
| JP | 2004289947 | 10/2004 |
| KR | 10-2004-0087153 | 10/2004 |
| KR | 1020060051652 | 5/2006 |

OTHER PUBLICATIONS

S.J. Ahn, et al., Highly Reliable 50nm Contact Cell Technology for 256Mb PRAM, 2005 Symposium on VLSI Technology Digest of Technical Papers, pp. 98-99.
T. Egami, et al., Atomic Size Effect on the Formability of Metallic Glasses, Journal of Non-Crystalline Solids, vol. 64, 1984, pp. 113-134.
Kazuya Nakayama, et al., Submicron Nonvolatile Memory Cell Based on Reversible Phase Transition in Chalcogenide Glasses, Japanese Journal of Applied Physics vol. 39, (2000), pp. 6157-6161.
Kazuya Nakayama, et al., Nonvolatile Memory Based on Phase Change in Se-Sb-Te Glass, Japanese Journal of Applied Physics, vol. 42, (2003) pp. 404-408.
Y.C. Chen, et al., Ultra-Thin Phase-Change Bridge Memory Device Using GeSb, 2006, IEEE.

* cited by examiner

*Primary Examiner* — Jerome Jackson, Jr.
*Assistant Examiner* — Paul A Budd
(74) *Attorney, Agent, or Firm* — Kile Park Goekjian Reed & McManus PLLC (57) ABSTRACT

Provided are a phase-change nonvolatile memory device and a manufacturing method thereof. The device includes: a substrate; and a stack structure disposed on the substrate and including a phase-change material layer. The phase-change material layer is formed of an alloy of antimony (Sb) and zinc (Zn), so that the phase-change memory device can stably operate at high speed and reduce power consumption.

6 Claims, 4 Drawing Sheets

PHASE-CHANGE NONVOLATILE MEMORY DEVICE USING SB-ZN ALLOY

CROSS-REFERENCE TO RELATED APPLICATION

This application claims priority to and the benefit of Korean Patent Application No. 2007-47526, filed May 16, 2007, the disclosure of which is incorporated herein by reference in its entirety.

BACKGROUND

1. Field of the Invention

The present invention relates to a phase-change nonvolatile memory device and a manufacturing method thereof, and more particularly, to a phase-change nonvolatile memory device in which a phase-change material layer is formed of an Sb—Zn alloy and brought into contact with an electrode layer capable of emitting heat due to externally supplied current to enable a reversible change between crystalline and amorphous phases, and a method of manufacturing the phase-change nonvolatile memory device.

2. Discussion of Related Art

Semiconductor devices may be categorized as either volatile memory devices or nonvolatile memory devices. A dynamic random access memory device (DRAM), which is a typical volatile memory device, needs to be refreshed during operation.

A low-integrated memory device consumes only a small amount of power to perform a refresh operation, while a highly-integrated memory device consumes a very large amount of power. For example, when a current refresh rate of 1 to 10 ms/Mbit is applied, the DRAM consumes a considerable amount of power on the whole. Specifically, in a current 1-Gbit DRAM, power consumed to perform a refresh operation dominates almost the entire power consumption. Despite an increase in power consumption, the DRAM is the most widely used memory module because it operates at high speed and is inexpensive.

If a nonvolatile memory device replaces a DRAM, it can be expected that not only power consumption but also operation time will be greatly reduced. Therefore, a vast amount of research has been conducted on nonvolatile memory devices lately. Among nonvolatile memory devices, flash memory has been most highly developed and is most widely used. However, since a flash memory operates at low speed and requires a relatively high voltage, it is utilized only for digital cameras and portable phones.

Meanwhile, memory devices should be highly reliable in rewrite operations. Although the flash memory is not very reliable in rewrite operations, when it is put to limited use in mobile devices, the number of times data is rewritten can be set to a small number. However, the rewrite reliability of the flash memory, which can be guaranteed in mobile devices, may be insufficient for stable operation of general-use personal computers (PCs).

Also, in order to satisfy various recent requirements of memory devices, a method of combining a DRAM, a static random access memory (SRAM), and a flash memory in an appropriate manner is being adopted. However, this method leads to a large increase in the entire size of a memory chip and is quite costly. For this reason, an integrated memory device that can be stably mounted on various devices for a variety of purposes is absolutely necessary. The integrated memory device strongly needs to have nonvolatility, high-speed, low power consumption, and high rewrite reliability, but semiconductor memory devices having all these characteristics have not yet been put into practical use. Therefore, exhaustive research into various nonvolatile memory devices has been progressing recently in search of possibilities and practicability of the respective nonvolatile memory devices from many angles.

Meanwhile, a phase-change nonvolatile memory device, which is called a phase-change RAM (PRAM), employs a phase-change material of which resistance depends on a crystal state thereof. That is, current or voltage is applied under appropriate conditions to control the crystal state of phase-change material so that data is stored in the PRAM. Also, the kind of stored data is read due to a change in resistance relative to the crystal state of the phase-change material. In this process, the PRAM performs a memory operation.

The PRAM may use a conventional phase-change material, such as a chalcogenide metal alloy, which is commonly employed for optical data storage devices, such as rewritable compact discs (CD-RWs) or digital versatile discs (DVDs). Since the manufacturing process of the PRAM is highly compatible with that of conventional Si-based devices, the PRAM may be easily embodied to have an integration density equal to or higher than that of DRAMs. Currently, the application of a Ge—Sb—Te chalcogenide material to PRAMs is being considered. However, in order to put the PRAMs to practical use, it is necessary to reduce power consumed during operation of the PRAMs, increase operating speed of the PRAMs, and control malfunctions caused by crystallization of an amorphous material and phase separation even after repetitive use of the PRAMs.

Conventionally, a Ge—Sb—Te chalcogenide metal alloy, especially, $Ge_2Sb_2Te_5$(GST) with a composition ratio of 2:2:5, is being widely used as the phase-change material. Since the GST with the foregoing composition ratio is generally used as an essential material for optical storage devices that use a change in phase due to laser beams, the physical properties of the GST are well known. Therefore, the GST may be easily applied to PRAMs, and thus most PRAMs are manufactured using GST at present.

Meanwhile, the integration density of semiconductor memory devices using GST as a phase-change material (hereinafter, GST memory devices) has reached about 256 Mb, and it is known that GST memory devices have very good operating characteristics (refer to S. J. Ahn et al., Tech. Dig. Symp. VLSI Tech. 2005, pp. 98-99). When doing research on advanced nonvolatile semiconductor memory devices, the integration density of about 256 Mb requires great improvements in process and device technology. By comparison, ferroelectric memory devices or magneto-resistance memory devices have an integration density of about 16 to 32 Mb due to difficulties in manufacturing and embodying the devices. Therefore, a PRAM has excellent scaling characteristics and is regarded as the most suitable memory device that can substitute for a conventional flash memory.

However, the PRAM should perform more stable operations in highly-integrated memory modules in order to take the place of flash memory. In particular, a phase-change material with better physical properties is needed to embody gigabit PRAMs. Since a conventional phase-change material (i.e., GST) has a high melting point of about 620° C., it is difficult to sufficiently cut down an operating current. Also, the GST is crystallized at a relatively low temperature of about 147° C., so that an amorphous recording layer is highly likely to be crystallized during operation. Further, in order to operate a PRAM as fast as a DRAM, it is also necessary to develop a phase-change material having fast phase-transition speed and, in particular, fast crystallization speed.

Therefore, when providing a method of manufacturing a PRAM using a new phase-change material that has a lower melting point than a conventional phase-change material (i.e., GST) and a faster crystallization speed than the GST, and is crystallized at a higher temperature than the GST, a high-speed low-power PRAM can be manufactured by a simple process at low cost.

In order to fulfill the above-described requirements of a high-quality PRAM, the following methods are predicted.

A first method is aimed at shortening a SET operation time taken to crystallize a phase-change material, which occupies the longest time during operation, using a rapidly crystallized material.

In a second method, the use of a phase-change material with a low melting point makes it easier to change the phase-change material into an amorphous phase, which consumes the largest current during operation. Therefore, the phase-change material with the low melting point can reduce the amount of current required to put the phase-change material into an amorphous phase during fusion and cooling processes.

In a third method, a phase-change material having a high crystallization temperature is employed. A phase-change material, which is put to a crystalline or amorphous phase, may be undesirably crystallized due to thermal crosstalking (i.e., heat emitted by an adjacent cell) during operation of a PRAM. In this case, the use of the phase-change material having a high crystallization temperature can prevent the thermal crosstalking.

In a fourth method, the composition of a phase-change material is simplified to prevent phase separation caused by repetitive phase transition. A conventional chalcogenide material, which is an N-added Ge—Sb—Te-based material, is being presently used for PRAMs with excellent characteristics. However, after repetitive drives of the PRAMs, the chalcogenide material may be separated into stable phases, such as GeTe and $Sb_2Te_3$, thereby causing malfunctions.

Therefore, the present inventors have done research on phase-change materials formed of various metal alloys and come to a conclusion that when an Sb—Zn alloy is used as a phase-change material, a SET operation time can be shortened and a PRAM can stably operate at high speed, thereby enhancing reliability of the PRAM and greatly reducing power consumption of the PRAM.

SUMMARY OF THE INVENTION

The present invention is directed to a phase-change nonvolatile memory device that stably operates at high speed and consumes low power.

Also, the present invention is directed to a method of manufacturing a phase-change nonvolatile memory device that stably operates at high speed and consumes low power.

One aspect of the present invention provides a phase-change nonvolatile memory device comprising: a substrate; and a stack structure disposed on the substrate and including a phase-change material layer, wherein the phase-change material layer is formed of an alloy of antimony and zinc (an Sb—Zn alloy).

In the phase-change nonvolatile memory device according to the present invention, the Sb—Zn alloy constituting the phase-change material layer may be expressed by the following chemical formula 1, $Zn_xSb_{100-x}$ [Chemical formula 1]

where x ranges from 5 to 35.

Also, the phase-change material layer may remain amorphous at a room temperature, make the transition from an amorphous phase to a crystalline phase at a temperature of about 180 to 220° C., and make the transition from the crystalline phase to the amorphous phase at a temperature of about 500 to 540° C.

A current required for the phase-change material layer to perform a reset operation may be less than 12 mA. When a voltage of 2.0 to 4.0 V is applied to the phase-change material layer, the phase-change material layer may operate at a speed of about 200 to 100 ns.

The stack structure may include: a lower electrode layer; a heater electrode layer disposed on the lower electrode layer; a first insulating layer disposed on the heater electrode layer and having a pore partially exposing the heater electrode layer; a phase-change material layer disposed on the first insulating layer to fill the pore; and an upper electrode layer disposed on the phase-change material layer. The stack structure may further include a second insulating layer interposed between the phase-change material layer and the upper electrode layer.

Another aspect of the present invention provides a method of manufacturing a phase-change nonvolatile memory device. The method includes the steps of: forming a lower electrode layer on a substrate; forming a heater electrode layer on the lower electrode layer; forming a first insulating layer to partially cover the heater electrode layer; forming a pore by patterning the first insulating layer to partially expose the heater electrode layer; forming a phase-change material layer of an Sb—Zn alloy on the first insulating layer to fill the pore; and forming an upper electrode layer on the phase-change material layer.

The Sb—Zn alloy constituting the phase-change material layer may be expressed by the following chemical formula 1, $Zn_xSb_{100-x}$ [Chemical formula 1]

where x ranges from 5 to 35.

The method may further include the step of forming a second insulating layer on the phase-change material layer after forming the phase-change material layer.

BRIEF DESCRIPTION OF THE DRAWINGS

The above and other features and advantages of the present invention will become more apparent to those of ordinary skill in the art by describing in detail exemplary embodiments thereof with reference to the attached drawings in which.

DETAILED DESCRIPTION OF EMBODIMENTS

A phase-change material layer is an essential layer of a phase-change nonvolatile memory device according to the present invention. Thus, the phase-change material layer may have various phase-change characteristics according to the kinds and compositions of constituent elements. In the present invention, the phase-change material layer is formed of an alloy of antimony (Sb) and zinc (Zn). The Sb—Zn alloy is obtained by adding Zn to Sb having a high tendency toward crystallization, so that distortion of a crystal structure of Sb caused by added Zn and partial disorder induced by relatively small Zn atoms prevent crystallization of Sb into a hexagonal close-packed (HCP) structure, thereby reinforcing the stability of an amorphous phase. The present invention is based on the foregoing mechanism of the Sb—Zn alloy.

Also, when a Sb—Zn phase-change material is formed of about 5 to 35 atomic percent (at. %) of Zn, the Sb—Zn phase-change material may make the phase transition from an amorphous phase to a crystalline phase due to supplied current and Joule heat of about 180° C. or higher generated by an electrode material during operation of a phase-change memory device. Conversely, the Sb—Zn phase-change material may reversibly make the phase transition from the crystalline phase to the amorphous phase due to Joule heat of about 500° C. or higher. Therefore, the Sb—Zn phase-change material can make use of a difference in electrical resistance between the crystalline and amorphous phases.

In this case, since an Sb—Zn alloy is crystallized at a temperature higher than conventionally used GST (147° C.) and melts at a lower melting point lower than the GST (620° C.), thermal crosstalking can be inhibited and low power consumption can be expected. In addition, in a $Zn_xSb_{100-x}$ phase-change material layer, as the content (100-x) of Sb increases, the amorphous stability of the $Zn_xSb_{100-x}$ phase-change layer is deteriorated, thereby reducing a time required to crystallize the amorphous $Zn_xSb_{100-x}$ phase-change layer.

The amorphous characteristic of metallic glass is typically reinforced when an element smaller than a matrix material is added to the matrix material (refer to T. Egami and Y. Waseda, J. Non-Cryst. Solids 64, 113-134 (1984)). That is, the amorphous characteristic of the metallic glass can be explained by the theory that the tendency of the metallic glass toward crystallization and its amorphous stability can be tuned by using an additive element.

In a phase-change memory device, it can be seen that a phase-change material layer can be crystallized at high speed and amorphized at low power due to a change between crystalline and amorphous phases. In other words, when the phase-change material layer has a high tendency toward crystallization, high-speed operating characteristics can be expected. On the other hand, when the phase-change material layer has high amorphous stability, the phase-change memory device can be driven at low power, and long-term phase stability (or long-term data retention) can be improved.

Accordingly, in the present invention, Sb having fast crystallization characteristics is used as a matrix material of metallic glass, and an additive element of gallium (G), indium (In), germanium (Ge), nitrogen (N), tin (Sn), magnesium (Mg), silicon (Si), selenium (Se), or zinc (Zn), which has a smaller atom size than Sb, may be added to Sb.

Among the foregoing alloy compositions, an Sb—Zn alloy has the best electrical characteristics, such as a difference in electrical resistance between crystalline and amorphous phases and a resistance of a crystalline layer, which affect generation of Joule heat required to amorphize the crystalline layer. The Sb—Zn alloy can be applied to phase-change memory devices and may even lead to mass production of the phase-change memory devices.

With regard to electrical characteristics, a Zn—Sb alloy formed of 5 to 35 at. % of Zn is the most suitable material for a phase-change material layer of a phase-change memory device. When the amount of Zn is less than 5 atomic percent (at. %), the phase-change material layer is crystallized at high speed, but cannot be easily amorphized. When the amount of Zn is greater than 35 at. %, it is difficult to crystallize the phase-change material layer at high speed.

In particular, the Zn—Sb alloy is a binary compound, unlike conventional ternary or multi-element phase-change materials, so that problems such as phase separation are not caused even after repetitive phase transitions, thereby improving the stability of the phase-change memory device. Also, since the Zn—Sb alloy is crystallized at a high temperature and melts at a low temperature, when the Zn—Sb alloy is applied to the phase-change memory device, thermal crosstalking can be inhibited and power consumption can be reduced.

Hereinafter, a phase-change nonvolatile memory device using an Sb—Zn alloy according to the present invention will be described more fully with reference to the accompanying drawings, in which exemplary embodiments of the invention are shown. This invention may, however, be embodied in different forms and should not be construed as limited to the embodiments set forth herein.

Figure 1:
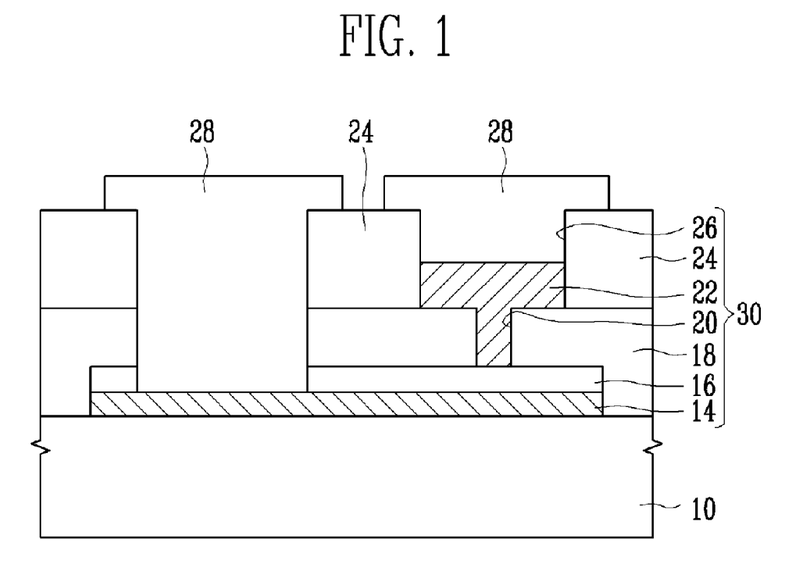
FIG. 1 is a cross-sectional view of a phase-change nonvolatile memory device according to an exemplary embodiment of the present invention.

FIG. 1 is a cross-sectional view of a phase-change nonvolatile memory device according to an exemplary embodiment of the present invention.

Referring to FIG. 1, the phase-change nonvolatile memory device according to the present invention includes a stack structure 30, which includes a lower electrode layer 14, a heater electrode layer 16, a first insulating layer 18, a phase-change material layer 22, a second insulating layer 24, and an upper electrode layer 28 that are stacked sequentially on a substrate 10.

The substrate 10 may be a silicon substrate or a silicon oxide layer obtained by thermally oxidizing the surface of silicon.

Meanwhile, a phase-change semiconductor memory device (hereinafter, $Zn_xSb_{100-x}$ memory device) using a $Zn_xSb_{100-x}$ phase-change material according to the present invention may be provided as an array type. When the $Zn_xSb_{100-x}$ memory device is integrated with circuit modules, such as an XY decoder for driving a memory array and a sense amplifier, it may be formed on a predetermined substrate including CMOS transistors for constituting the circuit modules.

Meanwhile, the stack structure 30 of the $Zn_xSb_{100-x}$ memory device according to the embodiment of the present invention may not be formed on the substrate 10, such as a silicon substrate or a silicon oxide layer. That is, the stack structure 30 may be formed on a predetermined substrate where a transistor to be manufactured along with an array including a $Sb_xSe_{100-x}$ memory device is prepared.

The lower electrode layer 14 may function as a lower terminal of the $Zn_xSb_{100-x}$ memory device and be formed of a low-resistance metal electrode. The metal electrode may be formed of, for example, platinum (Pt), tungsten (W), or a titanium-tungsten (Ti—W) alloy, using an ordinary method for forming a metal electrode.

The heater electrode layer 16 generates sufficient heat to change a crystal state of a phase-change material at a portion where the heater electrode layer 16 contacts the phase-change material layer 22. The heater electrode layer 16 generates heat due to current supplied through the lower electrode layer 14 and has a higher resistance than the lower electrode layer 14. The material of the heater electrode layer 14 significantly affects the operating characteristics of the $Zn_xSb_{100-x}$ memory device. Also, since a method of forming the heater electrode layer 16 influences the characteristics of a material, it should be carefully determined. For example, the heater electrode layer 16 may be formed of at least one selected from the group consisting of titanium nitride (TiN), titanium oxynitride (TiON), titanium aluminum nitride (TiAlN), tantalum aluminum nitride (TaAlN), and tantalum silicon nitride (TaSiN). In this case, the heater electrode layer 16 may be formed by a sputtering process.

The first insulating layer 18 electrically insulates the phase-change material layer 22 from the heater electrode layer 16 and the lower electrode layer 14, and the second insulating layer 24 electrically insulates the phase-change material layer 22 from the upper electrode layer 28. Simultaneously, an active pore 20 is formed in the first insulating layer 18 to partially expose the heater electrode layer 16 so that the phase-change material layer 22 partially contacts the heater electrode layer 16. As a result, the phase-change material layer 22 and the heater electrode layer 16 are thermally insulated from each other. The first insulating layer 18 may be formed at a low temperature, for example, from a room temperature to a temperature of about 500° C., so that the oxidation of the heater electrode layer 16 can be prevented during the formation of the first insulating layer 18. The second insulating layer 24 also may be formed at a low temperature, for example, from a room temperature to a temperature of about 300° C., in order to prevent the oxidation of the phase-change material layer 22 and a change in the crystal state thereof. Here, a temperature required to form the second insulating layer 24 is lower than a temperature required to form the first insulating layer 18 due to the fact that a material of the phase-change material layer 22 may be easily oxidized or the compositions of elements thereof may be changed at a temperature of 400° C. or higher. By comparison, a material of the heater electrode layer 16 is not easily oxidized at a temperature of 500° C. or lower. Meanwhile, a via hole 26 required for forming the upper electrode layer 28 is formed in the second insulating layer 24.

Also, since thermal transmission characteristics of the first and second insulating layers 18 and 24 significantly affect the operating characteristics of the $Zn_xSb_{100-x}$ memory device, it is necessary to carefully select materials of the first and second insulating layers 18 and 24. For example, the first and second insulating layers 18 and 24 may be formed of at least one selected from the group consisting of a silicon oxide layer, a silicon nitride layer, a silicon-based insulating layer, and an organic insulating layer that can be formed at a low temperature.

The phase-change material layer 22 is the most essential layer that constitutes the $Zn_xSb_{100-x}$ memory device. Although a conventional phase-change material layer is formed of an alloy of chalcogenide metal alloy, the phase-change material layer 22 according to the present invention is formed of an Sb—Zn alloy instead of a chalcogenide compound. In particular, the phase-change material layer 22 may be formed of the Sb—Zn alloy having about 5 to 35 at. % of Zn.

Meanwhile, the phase-change material layer 22 may be formed using a sputtering process or an electronic beam (e-beam) evaporation process.

Also, the phase-change material layer 22 formed of an Sb—Zn alloy remains amorphous at a room temperature and is crystallized at a temperature of about 180 to 220° C. Furthermore, the phase-change material layer 22 may make the transition from a crystalline phase to an amorphous phase at a temperature of about 500 to 540° C. The phase-change material layer 22 according to the present invention is crystallized at a higher temperature than a conventional GST phase-change material layer. As a result, while data is being continuously stored in the $Zn_xSb_{100-x}$ memory device, the stored data is not changed due to heat generated by the entire memory chip. Specifically, since the phase-change material layer 22 can remain amorphous at a relatively high temperature, the stored data can be prevented from being unreadable due to undesired re-crystallization during operation of the $Zn_xSb_{100-x}$ memory device. Also, a high crystallization temperature is required so that data stored in a predetermined memory cell cannot be changed during operation of adjacent memory cells.

The upper electrode layer 28 may function as an upper terminal of the $Zn_xSb_{100-x}$ memory device and be embodied as a low-resistance metal electrode like the lower electrode layer 14.

Figure 2:
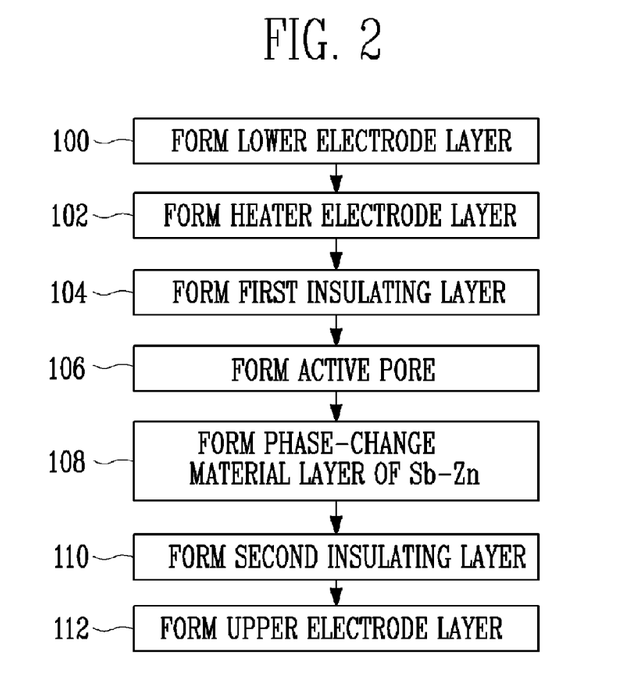
FIG. 2 is a process flowchart illustrating a method of manufacturing a phase-change nonvolatile memory device according to an exemplary embodiment of the present invention.
Figure 3:
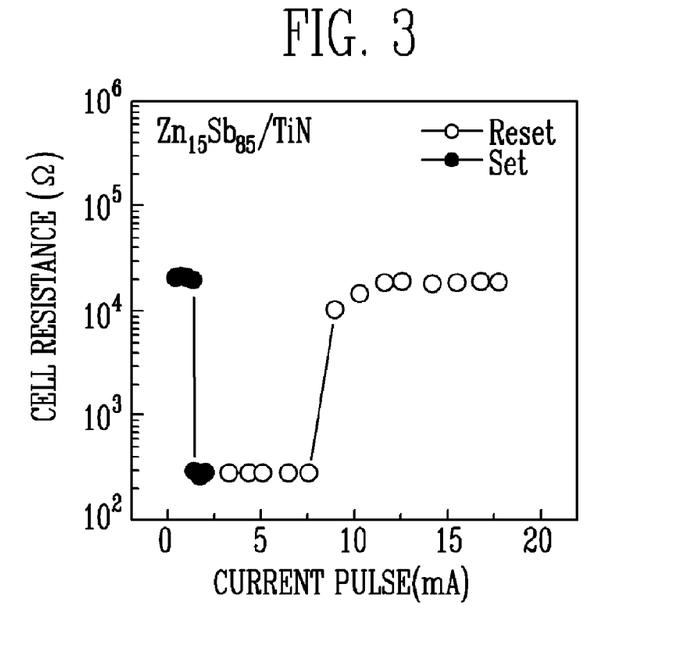
FIGS. 3 through 5 are graphs showing current-resistance (IR) characteristics of a phase-change $Zn_xSb_{100-x}$(x=15, 17, 23) nonvolatile memory device according to an exemplary embodiment of the present invention.
Figure 4:
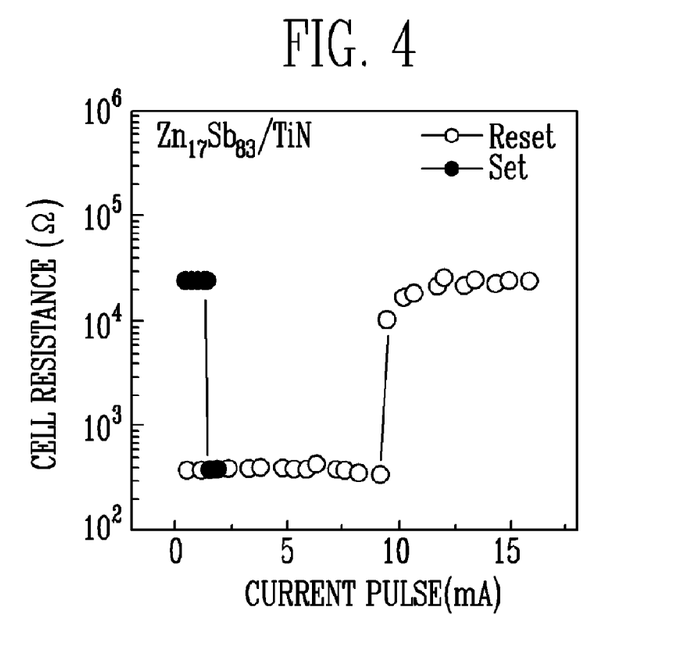
Figure 5:
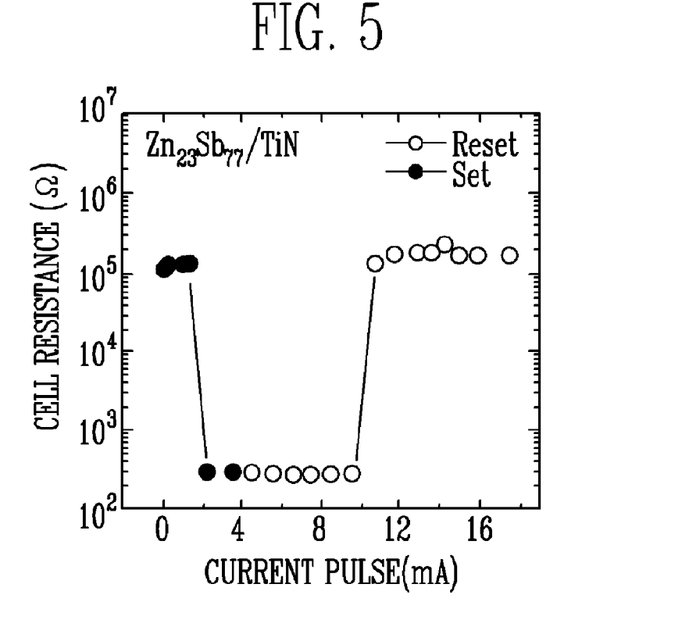

FIG. 2 is a process flowchart illustrating a method of manufacturing a phase-change nonvolatile memory device according to an exemplary embodiment of the present invention. Specifically, FIG. 2 illustrates a process of forming the stack structure 30 shown in FIG. 1. The flowchart shown in FIG. 2 is only an example of a method of manufacturing a phase-change nonvolatile memory device according to the present invention, and can be variously changed within the technical scope of the present invention.

Referring to FIG. 2, a lower electrode 14 is formed on a substrate 10 in step S100. The lower electrode layer 14 functions as a lower terminal of the phase-change memory device and is formed of a low-resistance metal. For example, the lower electrode layer 14 may be formed of Pt, W, or TiW using an ordinary process, such as a sputtering process or an e-beam evaporation process.

In step S102, a heater electrode layer 16 is formed on the lower electrode layer 14. The heater electrode layer 16 generates sufficient heat to change a crystal state of a phase-change material at a portion where the heater electrode layer 16 contacts a phase-change material layer 22. Thus, the resistance of the heater electrode layer 16 may be higher than that of the lower electrode layer 14. For example, the heater electrode layer 14 may be formed of at least one selected from the group consisting of TiN, TiON, TiAlN, TaAlN, and TaSiN using an ordinary process, such as a sputtering process.

In step S104, a first insulating layer 18 is formed on the heater electrode layer 16 using an ordinary process. In this case, the first insulating layer 18 is used to electrically or thermally insulate memory devices from one another in an array of phase-change memory devices. The first insulating layer 18 may be formed of a silicon oxide layer or a silicon nitride layer, but the present invention is not limited thereto and other insulating material layers having similar characteristics may be used. For instance, when a silicon oxide layer is used as the first insulating layer 18, it may be formed using a chemical vapor deposition (CVD) technique at a low temperature, specifically, from a room temperature to a temperature of about 500° C., so that oxidation of the heater electrode layer 16 can be prevented during the formation of the first insulating layer 18. Also, by forming the first insulating layer 18, an appropriate device isolation process may be performed. That is, when the first insulating layer 18 is a silicon oxide layer, a portion where the phase-change memory device will be formed can be defined using a dry or wet etching process, thereby isolating respective memory devices from one another.

In step S106, the first insulating layer 18 is etched to form a fine opening through which the phase-change material layer 22 contacts the heater electrode layer 16. In this case, the fine opening corresponds to a region where operation of the phase-change memory device occurs. Normally, the fine opening is prepared in a hole or pore shape. The fine opening will be referred to as an active pore 20. The size of the active pore 20 directly affects the operating characteristics of the phase-change memory device. The amount of current required for the operation of the phase-change memory device may be reduced by lessening the size of the active pore 20. Although the size of the active pore 20 may depend on the kind of lithography process and etching conditions, the active pore 20 may have a size of about 500 nm or less, for example, about 50 to 500 nm. The active pore 20 may be formed using not only i-line lithography equipment but also high-resolution patterning equipment, such as KrF and ArF eximer laser equipment and e-beam lithography equipment. Of course, formation of an active pore with a size of 50 nm or less may advantageously reduce the amount of current required to operate the phase-change memory device according to the present invention. However, since it is very difficult to form an extremely fine active pore using an ordinary process, the active pore may become nonuniform, thereby deteriorating the operational uniformity of the phase-change memory device.

In step S108, the phase-change material layer 22 is formed on the first insulating layer 18 to fill the active pore 20. The phase-change material layer 22 may have various phase-change characteristics according to constituent elements and composition of a metal alloy, which is crucial to the operation of the phase-change memory device. Conventionally, $Ge_2Sb_2Te_5$(GST), which is obtained by combining germanium (Ge), antimony (Sb), and tellurium (Te) in a composition ratio of 2:2:5, is most widely used as a phase-change material. In addition to GST, an As—Sb—Te-based chalcogenide alloy (refer to K. Nakayama et al., Jpn, J. Appl. Phys., Vol. 39, pp. 6157-6161, 2000) and an Se—Sb—Te-based chalcogenide alloy (refer to K. Nakayama et al., Jpn, J. Appl. Phys., Vol. 42, pp. 404-408, 2003) have been experimentally manufactured. However, in the present invention, the phase-change material layer 22 may be formed of an Sb—Zn alloy, preferably, an Sb—Zn alloy having about 5 to 35 at. % of Zn, by a sputtering process or an e-beam evaporation process. In this case, a one-element or multi-element target material is prepared.

By use of an etching process, the phase-change material layer 22 may be patterned only in a predetermined position where the phase-change memory device will be formed. Meanwhile, a chalcogenide phase-change material has mostly been used as a material of a recording medium of an optical data storage disc so far. Thus, characteristics that the chalcogenide phase-change material shows during a semiconductor process, such as an etching process, are not well known. Therefore, it is necessary to find out efficient etching conditions under which a phase-change material formed of predetermined elements can be applied to a phase-change memory device. An etching process according to the present invention may be performed by means of a dry etching apparatus using plasma. In this case, Ar or Cl gas may be used as an etch gas.

In step S110, a second insulating layer 24 is formed on the phase-change material layer 22. The second insulating layer 24 electrically insulates the phase-change material layer 22 from an upper electrode layer 28 that will be formed later. The second insulating layer 24 may be formed at a low temperature, specifically, from a room temperature to a temperature of about 300° C., in order to prevent oxidation of the phase-change material layer 22 and diffusion of the elements thereof. Also, the second insulating layer 24 may be formed of a silicon oxide layer using an electron cyclotron resonance (ECR) plasma CVD (ECRCVD) technique so that a crystal state of the phase-change material layer 22 cannot be changed during the formation of the second insulating layer 24. This is because the formation of the silicon oxide layer using the ECRCVD technique may be performed at a room temperature. Therefore, the present invention is characterized by forming the second insulating layer 24 at a room temperature.

Thereafter, a via hole 26 used for forming the upper electrode layer 28 may be formed in the second insulating layer 24. The via hole 26 may be formed by partially removing the second insulating layer 24 using a wet or dry etching process.

In step S112, the upper electrode layer 28 is formed on the second insulating layer 24 having the via hole 26. The upper electrode layer 28 may function as an upper terminal of the phase-change memory device and be formed of a low-resistance metal like the lower electrode layer 14. In some cases, a metal layer (not shown) may be further formed in order to improve contact characteristics between the upper electrode layer 28 and the phase-change material layer 22_and prevent occurrence of unnecessary reactions or movement of elements at an interface therebetween.

Embodiment 1

A lower electrode layer was formed of TiW on a substrate to a thickness of about 500 Å using a sputtering process. Thereafter, a heater electrode layer was formed of TiN on the lower electrode layer to a thickness of about 500 Å using a sputtering process. A first insulating layer was then formed of $SiO_2$ on the heater electrode layer. The first insulating layer was formed to a thickness of about 2,000 Å at a temperature of about 400° C. using a plasma enhanced CVD (PECVD) technique. Subsequently, the first insulating layer was dry etched using i-line lithography equipment to form an active pore with a size of about 500 nm.

A phase-change material layer was formed on the first insulating layer to fill the active pore. The phase-change material layer was formed of $Zn_xSb_{100-x}$(x=15) using an ultrahigh vacuum (UHV) multi-element sputtering process. In this case, Ar gas was injected into a chamber with a vacuum level of $5\times10^{-7}$ torr to induce a vacuum level of about 1 mtorr so that the Ar gas could be excited to generate plasma. After that, Zn and Sb were exposed to radio-frequency (RF) plasma and deposited.

Thereafter, a second insulating layer was formed of silicon oxide on the phase-change material layer. The second insulating layer was formed to a thickness of about 2000 Å at a room temperature using an ECRCVD technique.

In order to form an upper electrode layer on the second insulating layer, a via hole was formed by dry etching the second insulating layer. Thereafter, the upper electrode layer was formed of W on the second insulating layer having the via hole. The upper electrode layer was formed to a thickness of about 1000 Å using a sputtering process. In this process, a phase-change memory device was completed.

Embodiment 2

A phase-change memory device was manufactured in the same manner as described in Embodiment 1 except that the composition "x" of Zn was 17.

Embodiment 3

A phase-change memory device was manufactured in the same manner as described in Embodiment 1 except that the composition "x" of Zn was 23.

Comparative Example 1

A phase-change memory device was manufactured in the same manner as described in Embodiment 1 except that a phase-change material layer was formed of $Ge_2Sb_2Te_5$ (GST).

Experimental Example 1

Current-resistance (IR) characteristics of the phase-change memory devices manufactured in Embodiments 1 through 3 and Comparative example 1 were analyzed as shown in FIGS. 3 through 6. In order to make an analysis of the IR characteristics of the phase-change memory devices, the resistance of each of the phase-change memory devices was measured while varying the intensity of a current signal applied to write data. In this case, the width of the current signal was fixed at 1 μs.

Referring to FIGS. 3 through 6, it can be observed that each of the phase-change material layers made the transition from a high-resistance amorphous phase to a low-resistance crystalline phase (SET operation), and also made the transition from the low-resistance crystalline phase to the high-resistance amorphous phase (RESET operation).

Referring to FIGS. 3 through 6, all the phase-change memory devices exhibited stable and reversible SET/RESET operating characteristics. In particular, in the phase-change material layers according to the present invention (refer to FIGS. 3 through 5), a reset current was lower than when the GST phase-change material layer was used (refer to FIG. 6), so that the phase-change memory devices according to the present invention can be driven even at low power.

Figure 6:
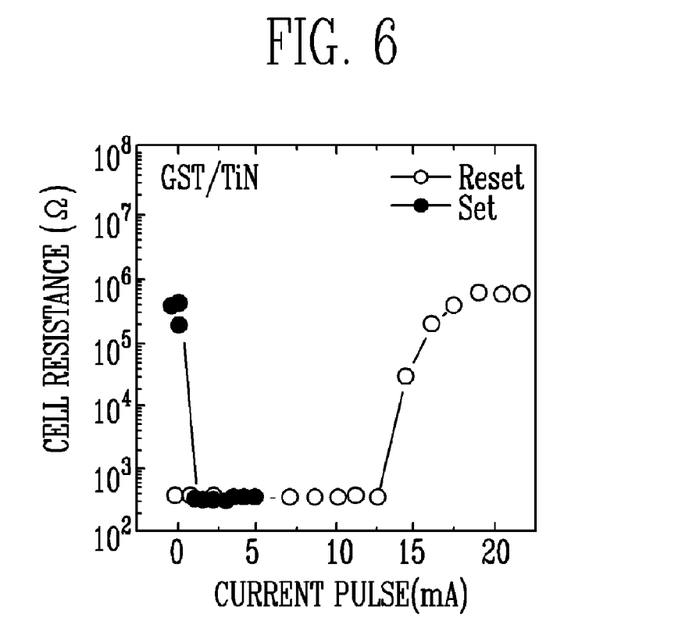
FIG. 6 is a graph showing IR characteristics of a GST memory device that is compared with the phase-change $Zn_xSb_{100-x}$(x=15, 17, 23) nonvolatile memory device according to the present invention.

Referring to FIG. 6, the conventional GST memory device required a current of about 12 mA to perform a RESET operation. By comparison, the $Zn_xSb_{100-x}$ memory devices shown in FIGS. 3 through 5 required currents of about 8, 9.5, and 10 mA, respectively, to perform the RESET operation. Therefore, it can be seen that the $Zn_xSb_{100-x}$ memory devices according to the present invention can reduce a write current required for the RESET operation. This is because the phase-change material layers formed of $Zn_xSb_{100-x}$ according to the present invention have melting points lower than that of the GST phase-change material layer. A reduction in the write current due to a low melting point of the $Zn_xSb_{100-x}$ phase-change material layer may be more noticeable in the RESET operation than in a SET operation. In order to make the transition from a low-resistance crystalline phase to a high-resistance amorphous phase, a process of fusing the $Zn_xSb_{100-x}$ phase-change material layer should be followed by a process of rapidly cooling the $Zn_xSb_{100-x}$ phase-change material layer.

Meanwhile, power consumption of the phase-change memory device wholly depends on a current required for the RESET operation that involves fusing the phase-change material layer and rapidly cooling the fused material layer to make the transition from a low-resistance crystalline phase to a high-resistance amorphous phase. Accordingly, a write current required for the RESET operation should be lessened to reduce the power consumption of the phase-change memory device. In other words, the phase-change material layer may be formed of a phase-change material having a low melting point.

Experimental Example 2

Figure 7:
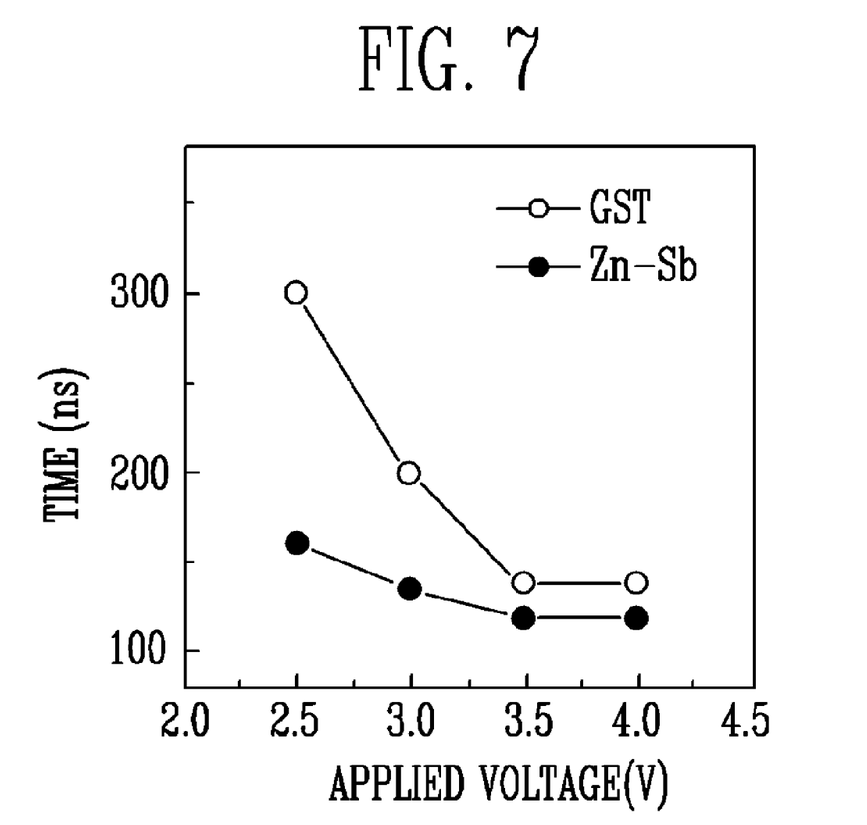
FIG. 7 is a graph showing set programming characteristics of the phase-change $Zn_xSb_{100-x}$(x=17) nonvolatile memory device according to the present invention and the GST memory device, which are manufactured under the same conditions, when a current signal is applied to both the memory devices.

FIG. 7 is a graph showing comparison results of SET operating characteristics of the phase-change memory devices according to Embodiment 2 and Comparative example 1 when a voltage signal is applied thereto.

Specifically, in order to confirm the operating speed and power consumption of the two phase-change memory devices, when a predetermined voltage signal was applied, SET operations of the phase-change memory devices were compared with each other. In this case, a voltage signal of about 4V or lower was applied to perform the SET operations. Also, a time taken for each of the phase-change memory devices to perform the SET operation was measured by varying the pulse width of the voltage signal. A resistance of each of the phase-change memory devices was measured by applying an additional voltage signal of about 1 V after each write operation is finished.

The phase-change memory device according to the present invention is compared with the conventional GST memory device because in the phase-change memory device according to the present invention, although the active pore has a size of about 500 nm, the phase-change memory device having the 500-nm active pore cannot satisfy operating conditions of practicably usable phase-change memory devices. Therefore, in order to clarify the high-speed low-power operating characteristics of the $Zn_xSb_{100-x}$ (x=17) memory device, the $Zn_xSb_{100-x}$ (x=17) memory device is compared with the conventional GST memory device.

Referring to FIG. 7, when a voltage of 3V was applied to the conventional GST memory device, the width of a voltage signal required for the SET operation was 200 ns. By comparison, when a voltage of 3V was applied to the $Zn_xSb_{100-x}$ (x=17) memory device according to the present invention, the width of a voltage signal required for the SET operation was 140 ns. The $Zn_xSb_{100-x}$ (x=17) memory device according to the present invention can shorten a time taken for the SET operation because the $Zn_xSb_{100-x}$ (x=17) phase-change material layer is crystallized faster than the conventional GST phase-change material layer. The operating speed of a phase-change memory device completely depends on a SET programming speed at which a high-resistance amorphous phase is changed into a low-resistance crystalline phase. This is because the transition from the low-resistance crystalline phase to the high-resistance crystalline phase is made faster during the RESET operation. Therefore, the phase-change material layer may be formed of a material with fast crystallization speed to improve the SET operating speed, so that the phase-change memory device can operate at high speed. In conclusion, the $Zn_xSb_{100-x}$ (x=17) memory device according to the present invention can operate at higher speed than the conventional GST memory device.

To summarize, the $Zn_xSb_{100-x}$ (x=17) memory device according to the present invention can operate at lower power than the conventional GST memory device and, upon comparison of the operating characteristics of the phase-change memory devices manufactured using the same structure and processes by changing only the kinds of materials of the phase-change material layer, the $Zn_xSb_{100-x}$ (x=17) memory device according to the present invention can reduce a write current required for a RESET operation.

According to the exemplary embodiments of the present invention as described above, a phase-change material layer is formed of an Sb—Zn alloy ($Zn_xSb_{100-x}$), so that a phase-change nonvolatile memory device can stably operate at high speed and require a small current, as compared with a conventional GST memory device.

Furthermore, by controlling a composition "x" of Zn in the $Zn_xSb_{100-x}$ (x=17), the phase-change material layer can be crystallized at high speed and melt at a low melting point. In other words, the operating speed and power consumption of the phase-change nonvolatile memory device according to the present invention can be tuned by controlling the composition of a material of the phase-change material layer.

In the drawings and specification, there have been disclosed typical preferred embodiments of the invention and, although specific terms are employed, they are used in a generic and descriptive sense only and not for purposes of limitation. As for the scope of the invention, it is to be set forth in the following claims. Therefore, it will be understood by those of ordinary skill in the art that various changes in form and details may be made therein without departing from the spirit and scope of the present invention as defined by the following claims.

What is claimed is:

1. A phase-change nonvolatile memory device comprising:
   a substrate; and
   a stack structure disposed on the substrate and including a phase-change material layer, the stack structure comprising:
   a lower electrode layer;
   a heater electrode layer disposed on the lower electrode layer;
   a first insulating layer disposed on the heater electrode layer and having a pore partially exposing the heater electrode layer;
   the phase-change material layer disposed on the first insulating layer to fill the pore; and
   an upper electrode layer disposed on the phase-change material layer,
   wherein the phase-change material layer is formed of an alloy of antimony and zinc (an Sb—Zn alloy), and
   wherein the pore has a size of between 50 and 500 nm.

2. The device according to claim 1, wherein the Sb—Zn alloy constituting the phase-change material layer is expressed by the following chemical formula 1, $$ZnxSb100-x,$$ [Chemical formula 1]

where x ranges from 5 to 35.

3. The device according to claim 1, wherein the phase-change material layer remains amorphous at a room temperature, makes the transition from an amorphous phase to a crystalline phase at a temperature of about 180 to 220° C., and makes the transition from the crystalline phase to the amorphous phase at a temperature of about 500 to 540° C.

4. The device according to claim 1, wherein a current required for the phase-change material layer to perform a reset operation is less than 12 mA.

5. The device according to claim 1, wherein, when a voltage of 2.0 to 4.0 V is applied to the phase-change material layer, the phase-change material layer operates at a speed of about 200 to 100 ns.

6. The device according to claim 1, wherein the stack structure further comprises a second insulating layer interposed between the phase-change material layer and the upper electrode layer.

* * * * *